United States Patent [19]

Brors

[11] Patent Number: 4,629,635

[45] Date of Patent: Dec. 16, 1986

[54] PROCESS FOR DEPOSITING A LOW RESISTIVITY TUNGSTEN SILICON COMPOSITE FILM ON A SUBSTRATE

[75] Inventor: Daniel L. Brors, Los Altos Hills, Calif.

[73] Assignee: Genus, Inc., Mountain View, Calif.

[21] Appl. No.: 590,117

[22] Filed: Mar. 16, 1984

[51] Int. Cl.$^4$ .............................. C23C 16/42
[52] U.S. Cl. .................. 427/255.2; 156/643; 156/651; 427/95; 427/255; 427/255.7; 427/307; 427/309; 427/419.7
[58] Field of Search ............ 427/89, 95, 255.2, 255.7, 427/255, 93, 307, 419.7, 309, 444; 156/643, 651

[56] References Cited

U.S. PATENT DOCUMENTS

| | | | |
|---|---|---|---|
| 4,065,369 | 12/1977 | Ogawa et al. | 204/164 |
| 4,180,596 | 12/1979 | Crowder et al. | 427/255 X |
| 4,247,579 | 1/1981 | Tuft | 427/309 X |
| 4,310,380 | 1/1982 | Flamm et al. | 156/657 X |
| 4,391,846 | 7/1983 | Raymond | 427/99 |
| 4,411,734 | 10/1983 | Maa | 156/651 |

OTHER PUBLICATIONS

Tsai et al, "Properties of Tungsten Silicide Film on Polycrystalline Silicon," J. Appl. Phys., vol. 52, No. 8, Aug. 1981, pp. 5350–5355.
Akitmoto et al, "Formation of $W_x$ Si–x by Plasma CVD," Appl. Phys. Lett., vol. 39, No. 5, Sep. 1981, pp. 445–447.
Tang et al, "Plasma-Enhanced Deposition of Tungsten, Molybdenum, and Tungsten Silicide Film," Solid State Technology, Mar. 1983, pp. 125–128.

*Primary Examiner*—Sadie L. Childs
*Attorney, Agent, or Firm*—Joseph H. Smith

[57] ABSTRACT

A composite film is provided which has a first layer of $WSi_x$, where x is greater than 2, over which is disposed a second layer of a tungsten complex consisting substantially of tungsten with a small amount of silicon therein, typically less than 5%. Both layers are deposited in situ in a cold wall chemical vapor deposition chamber at a substrate temperature of between 500° and 550° C. Before initiating the deposition process for these first and second layers, the substrate onto which they are to be deposited is first plasma etched with $NF_3$ as the reactant gas, then with $H_2$ as the reactant gas, both steps being performed at approximately 100 to 200 volts self-bias. $WSi_x$ is then deposited onto the surface of the substrate using a gas flow rate for silane which is 20 to 80 times the flow rate of tungsten silicide, followed by deposition of a tungsten complex as the second layer, using a gas flow rate for tungsten hexafluoride which is 1 to 3 times the flow rate of silane, and a gas flow rate of hydrogen which is about 10 times the flow rate of silane. Similarly, in another embodiment, the tungsten complex without the silicide layer is deposited directly onto a silicon surface using the same process as for the tungsten complex in the second layer of the first embodiment.

6 Claims, 4 Drawing Figures

PROCESS FOR DEPOSITING A LOW RESISTIVITY TUNGSTEN SILICON COMPOSITE FILM ON A SUBSTRATE

TECHNICAL FIELD

This invention relates to the deposition of tungsten and silicon complexes on semiconductor wafers by low pressure chemical vapor deposition (CVD).

BACKGROUND OF THE INVENTION

Advances in the reduction of device geometries of integrated circuits has created a high demand for improved microfabrication techniques and materials. Presently available processing methods can define dimensions as small as 1 to 1.5 micrometers, and even smaller geometries are desired. Improvements in dry etching and lithography, however, have already reduced the dimensions of high density VLSI circuits to the point where significant impediments to this quest are already apparent.

For example, the use of polycrystalline silicon (poly-Si), the most common gate electrode and interlayer interconnect material in present use in LSI-MOS devices, is a significant problem. Although poly-Si has many desirable properties such as good etchability, good oxidation characteristics, mechanical stability at high temperatures, excellent step coverage and adhesion, it has the major drawback of having a relatively high resistance. For most applications a sheet resistance of 20-30 ohms/square, the typical sheet resistance of a 5000 Angstrom layer of heavily doped poly-Si, is not a major contraint in circuit design. However, for VLSI designs, resistance of this magnitude does become a major constraint, since large VLSI circuits require long thin lines, resulting in unacceptable RC-time constraints and thereby limiting high speed performance at very reduced geometries. As a result, it appears that further improvement in MOS circuit design will depend on the development of more advanced interconnect technology.

As a replacement for poly-Si interconnects, refractory metals and refractory metal silicides appear to be attractive candidates and have been under recent investigation. Refractory metals, e.g. tungsten, typically have lower bulk resistance than poly-Si, but generally have poor oxidation characteristics and are easily etched in hydrogen peroxide/sulfuric acid, a common cleaner used in the semiconductor industry. In addition, they exhibit poor adhesion after annealing, especially on silicon dioxide. Hence, they have met with limited acceptance at the present time. Refractory metal silicides, on the other hand, although they have higher bulk resistivities than refractory metals themselves, generally have excellent oxidation resistance and exhibit other properties which make them compatible with I.C. wafer processing. For example, silicides have demonstrated stability over I.C. wafer processing temperatures, good adhesion, good chemical resistance and good dry etching characteristics.

Several approaches have been used to form these silicides, but each has met with significant problems. Co-evaporation has tended to produce films with marginal step coverage and significant shrinkage during anneal, the latter causing adhesion problems. Cosputtered films have resulted in better step coverage but a significant amount of argon is included in the films and there is significant shrinkage during anneal. Sputtered films from pressed silicide targets appear to minimize shrinkage, but oxygen, carbon, and argon contamination have generally resulted in films with inferior properties such as high bulk resistivities.

Even though some CVD systems have shown limited success, the reported compounds have exhibited a rough surface and have been columnar, bonded, or modular structures, or have been in the form of dust particles. (See "Formation of $W_xSi_{1-x}$ by plasma chemical vapor deposition," Appl. Phys. Lett. 39(5), 1 Sept. 1981, by K. Akitmoto and K. Watanabe.)

For the particular situation of tungsten silicide the deposition typically results from reduction of tungsten hexafluoride in silane in a standard quartz or vycor tube reactor. Generally, reactions at the substrate surface are thought to be as follows:

$SiH_4 \rightarrow Si + 4H$

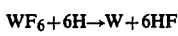
$WF_6 + 6H \rightarrow W + 6HF$ and

$W + Si \rightarrow WSi_2$

$7W + 3WSi_2 \rightarrow 2W_5Si_3$.

(See "A CVD Study of the Tungsten-Silicon System", by Jyh-Shuey Lo, et al., Proc. of the 4th International Conference on CVD, pp. 74–83.) Also, in most hot wall systems some gas phase reactions are likely as well, and can cause serious deleterious effects, particularly formation of dust particles which can contaminate the wafers.

Part of the problem in depositing these silicides in a thermally driven process stems from the very reactive nature of silane in tungsten hexafluoride and leads to very high surface reaction rates. In addition, the stoichiometry of compounds formed has tended to be rich in tungsten, and therefore unstable when subjected to subsequent processing ambients. The reactions proceed very quickly and at reduced deposition temperatures, so that the results are difficult to control both as to thickness and uniformity. Furthermore, they proceed not just on the desired substrate surfaces, but on other available surfaces in the reaction chamber, making control even more difficult and eventually contributing particulates which can contaminate the wafers on which deposition is desired.

Some of these problems in the deposition of tungsten silicide have been solved using a newly developed cold wall deposition system, the details of which are provided in U.S. patent application Ser. No. 480,030, U.S. Pat. No. 4,565,157, "METHOD AND APPARATUS FOR DEPOSITION OF TUNGSTEN SILICIDES", which is assigned to Genus, Inc. of Mountain View, Calif. filed Mar. 29, 1983, by Daniel L. Brors, et al., and which is hereby incorporated by reference. With that system, resulting films are generally of high quality, and are silicon rich, typically being represented by the formula $WSi_x$, where x can be varied between 2.0 and 4.0. These films exhibit good step coverage, 85% over a vertical step, and bulk resistivities of generally less than 75 micro-ohm cm can be obtained when wafers are annealed at 1000 degrees C. for 10 minutes, and less than 50 micro-ohm cm when annealed at 1100 degrees C. for 10 minutes. Before annealing, however, bulk resistivity is much higher, typically of the order of 500 to 800 micro-ohm cm. Such an annealing process is undesirable in systems which are sensitive to thermal cycling, such as the shallow junctions in VSLI circuitry. Annealing also can cause warpage in large wafers.

Hence, even with recent developments in the quality of silicide films, the current industrial requirements for films having low resistivity, excellent step coverage, good adhesion to semiconductor substrates and oxides, good oxidation resistance, and which do not require annealing have not been met.

SUMMARY OF THE INVENTION

In accordance with preferred embodiments of the invention, a composite film is provided which has a first layer of $WSi_x$, where x is greater than 2, over which is disposed a second layer of a tungsten complex consisting substantially of tungsten with a small amount of silicon therein, typically less than 5% by weight. Both layers are deposited in situ in a cold wall chemical vapor deposition chamber at a substrate temperature of between 500° and 550° C. Deposition will occur below 500° C., however, the adhesion of the film to oxides is marginal below 500° C.

Before initiating the deposition process for these first and second layers, the substrate onto which they are to be deposited is first plasma etched in a two-step process, first with $NF_3$ as the reactant gas, then with $H_2$ as the reactant gas, both steps being performed at approximately 100 to 200 volts self-bias. This two-step etching prepares the surface to provide good adhesion of the composite film to a substrate having silicon, silicon dioxide, nitride or other materials on its surface.

$WSi_x$ is then deposited onto the surface of the substrate using a gas flow rate for silane which is 20 to 80 times the flow rate of tungsten silicide. Following deposition of $WSi_x$, the tungsten complex is deposited as the second layer, using a gas flow rate for tungsten hexafluoride which is 1 to 3 times the flow rate of silane, and a gas flow rate of hydrogen which is about 10 times the flow rate of silane.

The resulting composite film exhibits excellent step coverage, low bulk resistivity, low contact resistance, excellent adhesion to all surfaces of interest, and is impervious to wet etching.

Similarly, in another embodiment, the tungsten complex without the silicide layer is deposited directly onto a silicon surface using the same process as for the tungsten complex in the second layer of the first embodiment. The resulting single layer film of the tungsten complex appears to have the same composition and function as the second layer of the first embodiment, and based on its unique properties constitutes a new composition of a tungsten and silicon combination which can best be described by the process of making it.

DETAILED DESCRIPTION OF THE INVENTION

Figure 1:
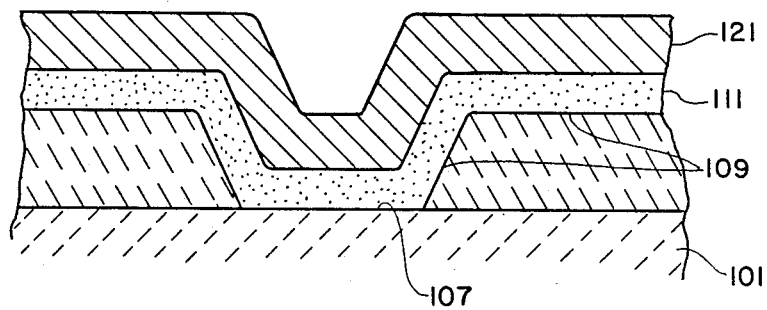
FIG. 1 shows a cross-sectional view of a composite film according to the invention.

Shown in FIG. 1 is substrate 101 having a silicon surface 107 and a silicon dioxide surface 109, as might be encountered in the present day manufacture of semicondutor devices. In accordance with the preferred embodiment of the invention, disposed on these surfaces is a first layer 111 of tungsten silicide deposited in situ by CVD which has the chemical formula $WSi_x$, where x is greater than or equal to 2, and is preferably in the range of 2 to 4. On top of layer 111 is a second layer 121 also deposited in situ by CVD which is a tungsten complex of substantially tungsten with a small percentage of silicon, the preferred percentage of silicon in the complex being less than 5% by weight, but preferably larger than about 0.1%.

Figure 2:
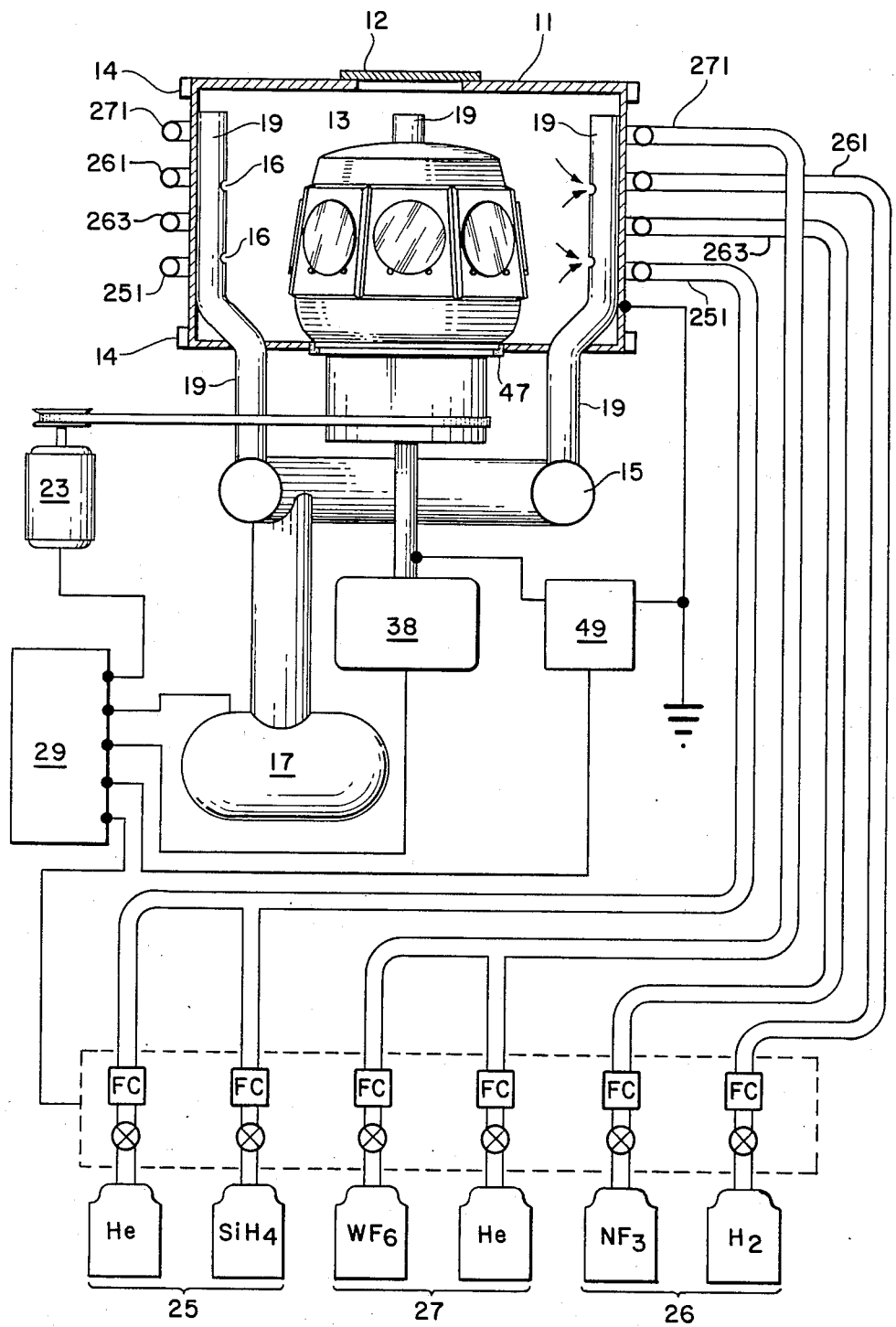
FIG. 2 depicts a low pressure CVD system used for depositing the composite film of FIG. 1, and shows a cross-sectional view through the vacuum housing of the system.
Figure 3:
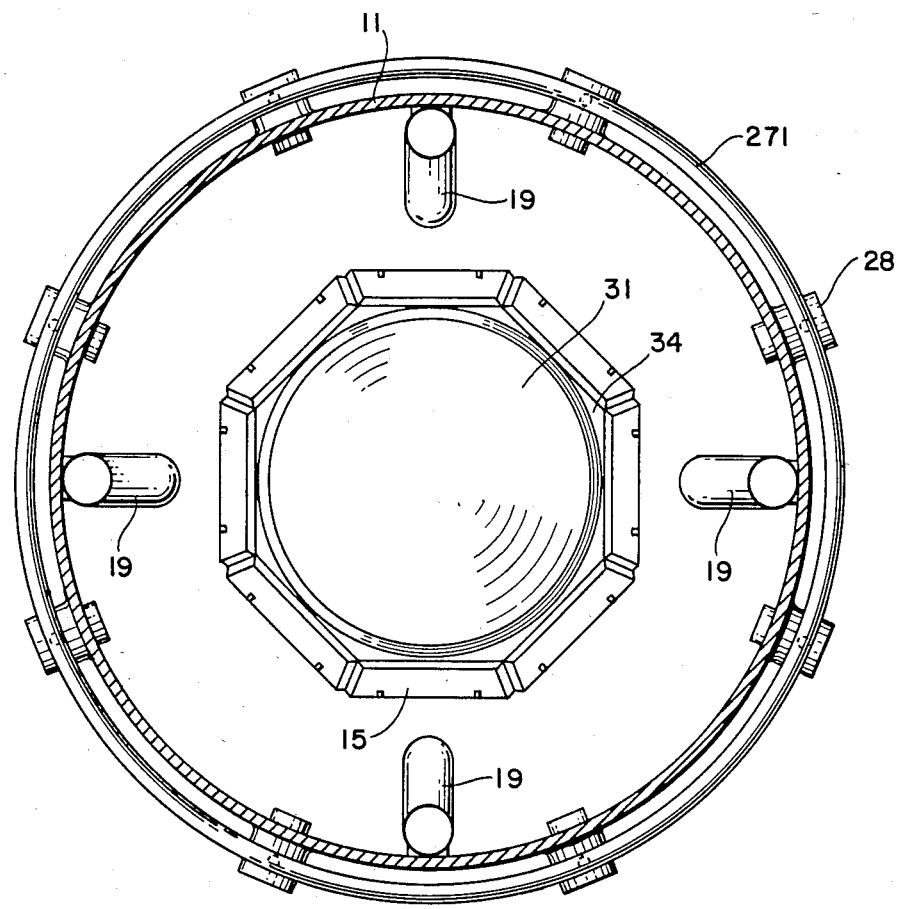
FIG. 3 shows a top view of the vacuum housing with the top of the housing removed.

In this preferred embodiment, both layer 111 and layer 121 are deposited in a cold wall low pressure CVD reactor such as that illustrated in FIGS. 2 and 3. This reactor is substantially the same as that described in the U.S. patent application, "METHOD AND APPARATUS FOR DEPOSITION OF TUNGSTEN SILICIDES", which was discussed earlier in the Background of the Invention. The features not shown there, but which are present in the instant invention are two gas lines, hydrogen line 261 and $NF_3$ line 263, the function of which will be discussed subsequently.

The apparatus is a low pressure CVD reactor system having a cylindrical vacuum chamber, or housing 11, housing 11, containing a substrate turret assembly 13 at its center for holding wafers during deposition. Typically housing 11 is approximately 60 cm in diameter, having a height of about 30 cm, and is typically constructed of aluminum. The housing includes a locking, vacuum-tight door 12 for introducing wafers into the system and has a circular hole in its floor for accommodating turret assembly 13.

Housing 11 is typically water cooled by cooling coils 14 to a temperature sufficiently low that significant deposition does not occur on the housing inner walls. Generally temperatures for the housing vary depending on the particular materials being deposited, but for tungsten silicides housing temperatures of about 100 degrees C. considerably reduce unwanted deposition on the inner walls. Further decreases in wall temperature to below about 80 degrees C., or more preferably to below 30 degrees C., are even more dramatic. Deposition on the housing walls at these latter temperatures is nearly eliminated, presumably due to the reduced energy available for causing dissociation of the reactants at the wall surface, and due to the fact that generally chemical reactions proceed at a slower rate at reduced temperatures. At 30 degrees C., the deposition on the chamber walls is so minimal that it is quite difficult to measure. Rough estimates appear to indicate that the ratio of the thickness of tungsten silicide deposited on the walls relative to the thickness deposited on the wafers is at most one to a thousand, and is probably even lower.

An exhaust manifold 15 is attached to housing 11 for permitting evacuation of the chamber, exhaust manifold 15 being attached to a vacuum/exhaust system 17 which is typically capable of pumping the system down to less than 10 mT. Exhaust manifold 15 consists of a four-inch (4") diameter, semi-circular, aluminum exhaust plenum which hangs below the housing, with four two-inch (2") diameter connection pipes 19 spaced uniformly around the manifold. These connection pipes extend up into the housing 11 approximately 25 centimeters and make good thermal contact with the housing walls so that the pipes too are maintained at a relatively low temperature. Each connection pipe is capped at the top and has two openings 16, typically about ¾ inches in diameter, one near the top and one near the bottom, so that the housing has a total of eight exhaust ports distributed around its periphery. This arrangement results in a very even exhaust and contributes significantly to achieving control during the deposition process. The vacuum/exhaust system 17 typically includes a vacuum throttle valve and controller, a high accuracy manometer, a rotary vane pump, and a Roots blower to boost the vane pump during pump down and in vacuum maintenance. Vacuum pressure is programmable and is under supervision by microprocessor 29.

Reactant gasses are typically contained in three banks, a first bank 25 holding process helium and silane, a second bank holding hydrogen and $NF_3$, and a third bank 27 holding helium carrier and tungsten hexafluoride. The gasses in banks 25 and 27 are mixed and diffused at low pressure in a mixing chamber, such as mixing chamber 28, attached to the wall of housing 11 to provide a reactant gas mixture which is introduced into the housing immediately opposite the wafers. To ensure uniform introduction of gasses, eight mixing chambers such as chamber 28 are distributed evenly around the housing as shown in FIG. 1B.

Figure 4:
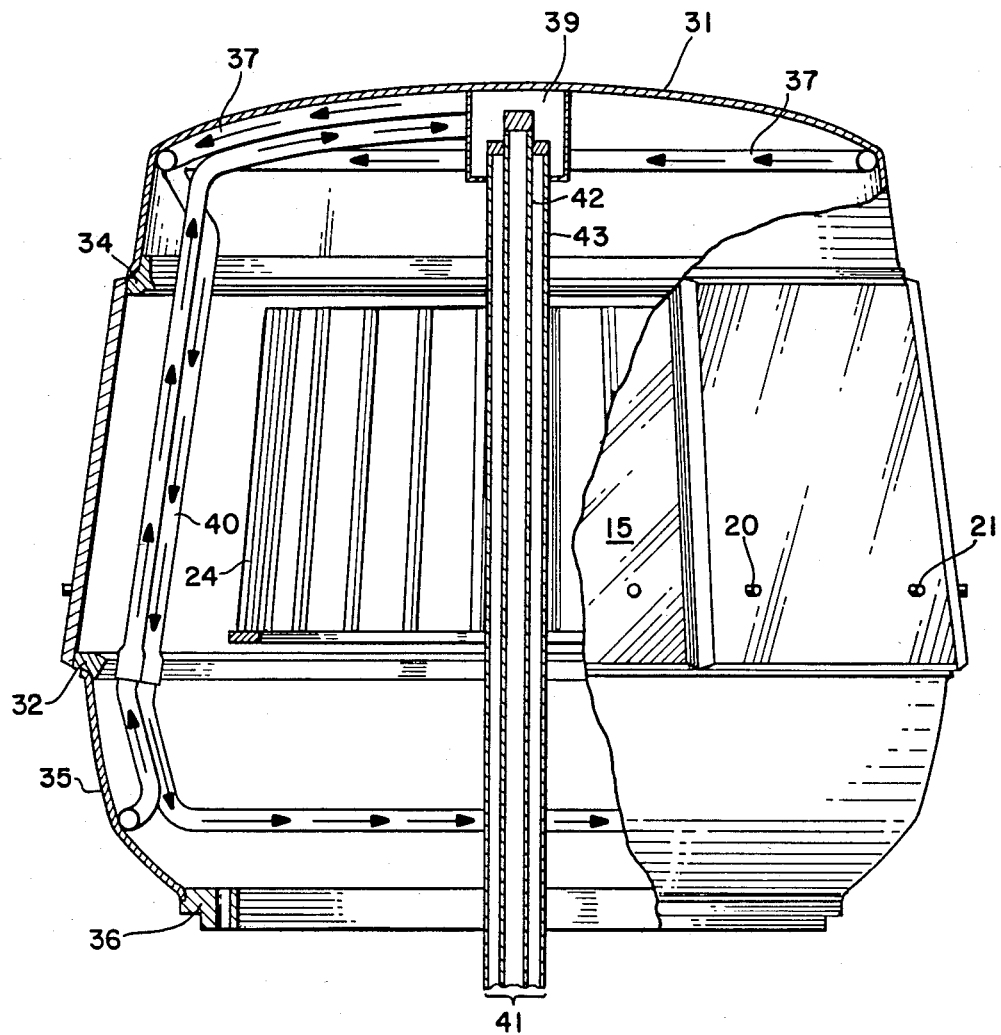
FIG. 4 provides a cut away view of a substrate turret assembly for holding substrates in the low pressure CVD system.

Generally turret assembly 13 rests on the bottom of housing 11 on a rotating, electrically isolated vacuum seal 47. As shown from the top view (FIG. 3), turret assembly 13 is typically octagonal in its horizontal cross-section, having a wafer platen, or chuck, such as wafer platen 15, for holding wafers on each face of the octagon. Each wafer platen is typically cut into a trapezoidal shape from ½-inch thick monel sheet stock, the top of each platen being approximately 5 inches wide, the bottom being approximately 6 inches wide, and the height of the trapezoid being aproximately 6 inches, and is designed to hold 5 inch wafers. As illustrated in FIG. 3 and FIG. 4 the platens are generally welded together at their edges and to a top octagon ring 34 and a bottom octagon ring 32. A cap 31 approximately 2 inches high and 10 ½ inches in diameter at the top and a base 35 approximately 3 inches deep and 10 ½ inches in diameter at the bottom are also welded to the top and bottom octagon rings respectively, and the entire assembly is attached to a chuck base ring 36, which, when in contact with vacuum seal 47 on the bottom of housing 11, forms a vacuum tight system.

During processing, turret assembly 13 can be rotated slowly by a motor 23 at constant speed, typically on the order of 1 RPM, to enhance deposition uniformity. As illustrated in the cut-away view provided in FIG. 4, turret assembly 13 is heated from the inside by a stationary array of three banks of lamps, such as lamp 24, each bank containing eight 500-watt quartz lamps controlled by solid-state rectifiers.

Typically, the entire turret assembly is constructed of monel because of its corrosion resistance and its ability to withstand high temperatures. The platens conduct heat from their back surface to their front surface where the wafers are located.

The temperature at the outer surface of the platens is programmable and is controlled by microprocessor 29. Temperature information feedback to the microprocessor is provided via a stationary infrared sensor viewing the inside of the turet assembly. The rotation of turret assembly 13 allows the sensor to measure temperature throughout the assembly circumference.

To avoid deposition on areas of the turret assembly other than the platens and wafers, turret assembly 13 is typically provided with a cooling system in cap 31 and base 35. Cooling is provided by a ¼-inch water pipe 37, which substantially traverses the circumference of both the cap and base while maintaining good thermal contact therewith.

Typically, the temperature of the cap and base are maintained below about 30 degrees C., to avoid any significant deposition on these parts as was done for the housing walls, and to ensure that vacuum seal 47 remains cool. It should be understood, however, that the entire surface of the cap and base cannot be maintained at this latter temperature due to the temperature gradient between the heated platens and the circumferential contact of water pipe 37.

Also included is a 2 kilowatt RF generator system 49 attached to turret assembly 13, which can be used with gasses $H_2$ and $NF_3$ for plasma etching of substrates and for occasional cleaning. The frequency of generator 49 is typically 13.56 MHz.

In order to produce a high quality composite film with this apparatus, the processing steps are specially tailored. Typically, the chamber is first purged with nitrogen. Then wafers are loaded into the system and the housing is pumped down to a base pressure of from 10 to 20 mT.

After pump down, a plasma etch is instituted, first with $NF_3$ at a chamber pressure of about 50 mT and a gas flow rate of about 20 cc/min. for approximately one minute. Then the wafers are plasma etched a second time using $H_2$ as the etchant gas at a chamber pressure of about 100 mT and a gas flow rate of about 50 cc/min. for approximately three minutes. In both of these etches, the power density is typically about 3 to 5 watts per square inch. Also for effective etching, it is preferable that a D.C. self-bias of 100–200 volts be maintained during the process. Furthermore, it has been found that the etching process is relatively ineffective with a D.C. self-bias lower than about 100 volts.

The purpose of this two-step etching process is to insure that there will be good adhesion for the later deposited composite film. Although the mechanism is not completely understood, it has been found that although the $NF_3$ etches the wafer surface, an $H_2$ etch is required to remove residual fluoride complexes on the wafer surface to allow adhesion of the later deposited films to all types of materials.

After plasma etching, the housing is pumped out and the system is then ready for deposition of layer 111 of $WSi_x$. First, helium is started in both the tungsten hexafluoride line 271 and the silane line 251 to prevent cross contamination between gas lines and unwanted reactions therein, then the silane is begun. Typical flow rates are 100 cc/min. for helium and 1000 cc/min. for silane. The chamber pressure is then, set to about 200 mT, and the tungsten hexfluoride is turned on at a flow rate of about 14 cc/min. for the desired deposition time, typically until layer 111 is about 600 to 1000 Å thick. It is important to take precautions to avoid significant overshoot (not >20%) in the initiation of flow of the tungsten hexafluoride. (Generally the flow rate for silane should be 20 to 80 times the flow rate for the tungsten hexafluoride depending on the deposition time and desired stoichiometry of the silicide and the minimum optimal flow rate for tungsten hexafluoride has been found to vary between about 1.7 to 2.0 cc/min. per 5 inch wafer.) At the end of the deposition, the gasses are turned off in the reverse order from which they were turned on, and the system is again pumped out. Typical deposition rates can be varied from about 100 to about 10,000 Angstroms/min depending on gas flows, temperature, and chamber pressure. However, it is typical that layer 111 be deposited at temperatures in the range of 500° C. to 550° C., which corresponds to the preferred range of deposition temperatures for layer 112 which will be discussed shortly.

After deposition of the silicide as described above, layer 121 of the tungsten complex is deposited using substantially the same procedures as for layer 111, the primary differences being in the flow rates and the addition of hydrogen gas as a reactant in the process, which at high temperature helps to reduce the tungsten hexaflouride to tungsten. For this layer, the flow rate for tungsten hexaflouride is preferably 1 to 3 times the flow rate of the silane, and hydrogen gas is introduced into the chamber at a flow rate of about 10 times the flow rate of silane. In the preferred implementation, using a silane flow rate of 100 cc/min. with a tungsten hexaflouride flow rate of 150 cc/min. and a hydrogen flow rate of 1000 cc/min. at a wafer temperature of about 500° C. yields a growth rate of about 2000 Å/min. for the tungsten complex of layer 121.

Analysis of the resulting tungsten complex shows that layer 121 is generally less than 5% silicon, by weight exhibits a low bulk resistivity of 8 to 10 micro-ohms cm without annealing, has greater than 95% step coverage for an 80° step, has no hillock formation, is readily etched by plasma techniques, and exhibits excellent adhesion to polysilicon, single crystal silicon, nitrides, silicon dioxide and other surfaces. In addition, the tungsten complex is especially resistant to wet etches, whereas pure tungsten for example etches in hydrogen peroxide/sulfuric acid, which is commonly used as a cleaner in the semiconductor industry.

More importantly, the contact resistance of the composite film on doped silicon is quite low, $2 \times 10^{-8}$ ohm $cm^2$ compared to $5 \times 10^{-6}$ ohm $cm^2$ for aluminum when deposited on doped n-type silicon with a surface doping concentration of $10^{20}/cm^3$, aluminum being one of the most highly used interconnect materials. This is especially significant for small geometries, where interconnect resistance is dominated by contact resistance. For example, the contact resistance of aluminum to such an n-type silicon surface for a contact of dimensions 1 micron $\times$ 1 micron is approximately 500 ohms, while a contact of the same size constructed of the composite layer according to the invention exhibits a contact resistance of approximately 2 ohms.

Another important feature is that heating the composite layer at temperatures up to 700° C. does not appear to affect the resistivity and adhesion is unaffected as well. For temperatures over 800° C., where the composite film is deposited over silicon, the formation of additional tungsten silicide occurs, but for the composite film on silicon dioxide, no changes have been observed in the film up to 1000° C. It is important to re-emphasize however, that annealing is not required to obtain low bulk resistance with the composite film. This is especially significant for small VLSI geometries where heating of the wafers above about 800° C. can cause difficulties with shallow junctions, the dopants diffusing further into the wafer thereby destroying the device.

Another embodiment of the invention is to deposit a single layer film of the tungsten complex directly onto a silicon wafer, rather than depositing a composite film. In this instance, the processing for this single layer film is precisely as for layer 121 in the composite film. In this embodiment the physical attributes of the single layer film appear to be identical to those of layer 121 and exhibits all of the qualities of the composite film, except that the single layer does not adhere to silicon dioxide on thermal cycling, even if the substrate surface is pretreated by two plasma etches as before. Although the precise structure of this new composition of tungsten and silicon is not completely known, it clearly exhibits properties not heretofore known in the art for tungsten and silicon complexes.

What is claimed is:
1. In a chemical vapor deposition reactor having a vacuum housing, a process for depositing a composite film on a substrate comprising the steps of:
   a. plasma etching the substrate;
   b. after step a., depositing a first layer of $WSi_x$ over the substrate, with x being greater than or equal to 2; and
   c. depositing over the first layer a second layer of a tungsten and silicon complex having a percentage of silicon of less than 5% by weight.
2. A process as in claim 1 wherein step a. includes:
   d. plasma etching the substrate using $NF_3$ as an etchant gas; and
   e. after step d. plasma etching the substrate using $H_2$ as an etchant gas.
3. A process as in claim 2 wherein step b. includes:
   f. providing a flow of silane and tungsten hexafluoride into the vacuum housing, with the rate of flow of silane being 20 to 80 times the flow rate of tungsten hexafluoride;
   g. during step f., heating the substrate to a temperature $T_1$ to cause deposition of $WSi_x$ on the substrate, where x is greater than or equal to 2;
   h. during step g., actively cooling the vacuum housing to a temperature $T_2$ less than $T_1$ below which deposition on the vacuum housing of the $WSi_x$ is substantially eliminated.
4. A process as in claim 3 wherein step c. includes:
   i. providing a flow of silane, tungsten hexafluoride, and hydrogen into the vacuum housing, with the ratio of the flow rate of tungsten hexafluoride being in the range of 1 to 3 times the flow rate of silane, and the flow rate of hydrogen being approximately 10 times the flow rate of silane;
   j. during step i., heating the substrate to a temperature $T_3$ to cause deposition of a complex of tungsten and silicon over the first layer, with the percentage of silicon being less than 5% by weight.
5. A process as in claim 4 wherein $T_3$ is in the range of 500° C. to 550° C.
6. A process as in claim 1 wherein step c. includes:
   k. providing a flow of silane, tungsten hexafluoride, and hydrogen into the vacuum housing, with the ratio of the flow rate of tungsten hexafluoride being in the range of 1 to 3 times the flow rate of silane, and the flow rate of hydrogen being approximately 10 times the flow rate of silane; and
   l. during step k., heating the substrate to a temperature $T_3$ to cause deposition of a complex of tungsten and silicon over the first layer, with the percentage of silicon being less than 5% by weight.

* * * * *